(12) United States Patent
Thies et al.

(10) Patent No.: US 7,786,741 B2
(45) Date of Patent: Aug. 31, 2010

(54) MEASURING TIP FOR HIGH-FREQUENCY MEASUREMENT

(75) Inventors: Steffen Thies, Waging (DE); Michael Wollitzer, Fridolfing (DE)

(73) Assignee: Rosenberger Hochfrequenztechnik GmbH & Co. KG, Fridolfing (DE)

( * ) Notice: Subject to any disclaimer, the term of this patent is extended or adjusted under 35 U.S.C. 154(b) by 416 days.

(21) Appl. No.: 11/721,628

(22) PCT Filed: Nov. 21, 2005

(86) PCT No.: PCT/EP2005/012444
§ 371 (c)(1),
(2), (4) Date: Jun. 13, 2007

(87) PCT Pub. No.: WO2006/066676
PCT Pub. Date: Jun. 29, 2006

(65) Prior Publication Data
US 2008/0113548 A1   May 15, 2008

(30) Foreign Application Priority Data
Dec. 20, 2004   (DE) .................. 20 2004 019 636 U

(51) Int. Cl.
*G01R 31/26* (2006.01)
(52) U.S. Cl. .................................... 324/754
(58) Field of Classification Search .......... 324/754–765
See application file for complete search history.

(56) References Cited

U.S. PATENT DOCUMENTS

| | | | |
|---|---|---|---|
| 4,697,143 A * | 9/1987 | Lockwood et al. .......... | 324/754 |
| 4,748,427 A * | 5/1988 | Buoli ........................ | 333/227 |
| 4,849,689 A * | 7/1989 | Gleason et al. ............. | 324/754 |
| 4,853,627 A | 8/1989 | Gleason et al. | |
| 4,894,612 A | 1/1990 | Drake et al. | |
| 5,003,253 A | 3/1991 | Majidi-Ahy et al. | |
| 5,506,515 A * | 4/1996 | Godshalk et al. ............ | 324/762 |
| 6,242,930 B1 * | 6/2001 | Matsunaga et al. .......... | 324/754 |
| 6,281,691 B1 * | 8/2001 | Matsunaga et al. .......... | 324/754 |
| 6,815,963 B2 * | 11/2004 | Gleason et al. ............. | 324/754 |
| 7,427,868 B2 * | 9/2008 | Strid et al. .................. | 324/754 |
| 2002/0075019 A1 * | 6/2002 | Hayden et al. .............. | 324/754 |

FOREIGN PATENT DOCUMENTS

WO    WO0122097 A    3/2001

* cited by examiner

*Primary Examiner*—Ha Tran T Nguyen
*Assistant Examiner*—Joshua Benitez
(74) *Attorney, Agent, or Firm*—DeLio & Peterson, LLC; Robert Curcio

(57) ABSTRACT

The invention relates to a contact arrangement for a measuring probe or a measuring head for measuring high frequency, especially on a semiconductor wafer. The arrangement comprises a contact end for electrically contacting planar structures. A coplanar conductor structure having at lease two conductors carried by a dielectric is provided at the contact end. Between the dielectric and the contact end, the measuring tip is configured in such a manner that the conductors of the coplanar conductor structure are disposed in mid-air and in a resilient manner in relation to the dielectric retaining them. The invention is characterized in that the dielectric is provided with at least one arrangement for transmitting electrical signals, the arrangement being electrically connected to at least one conductor of the conductor structure in such a manner that the arrangement transmits signals from the at least one conductor that is electrically connected to the arrangement.

15 Claims, 1 Drawing Sheet

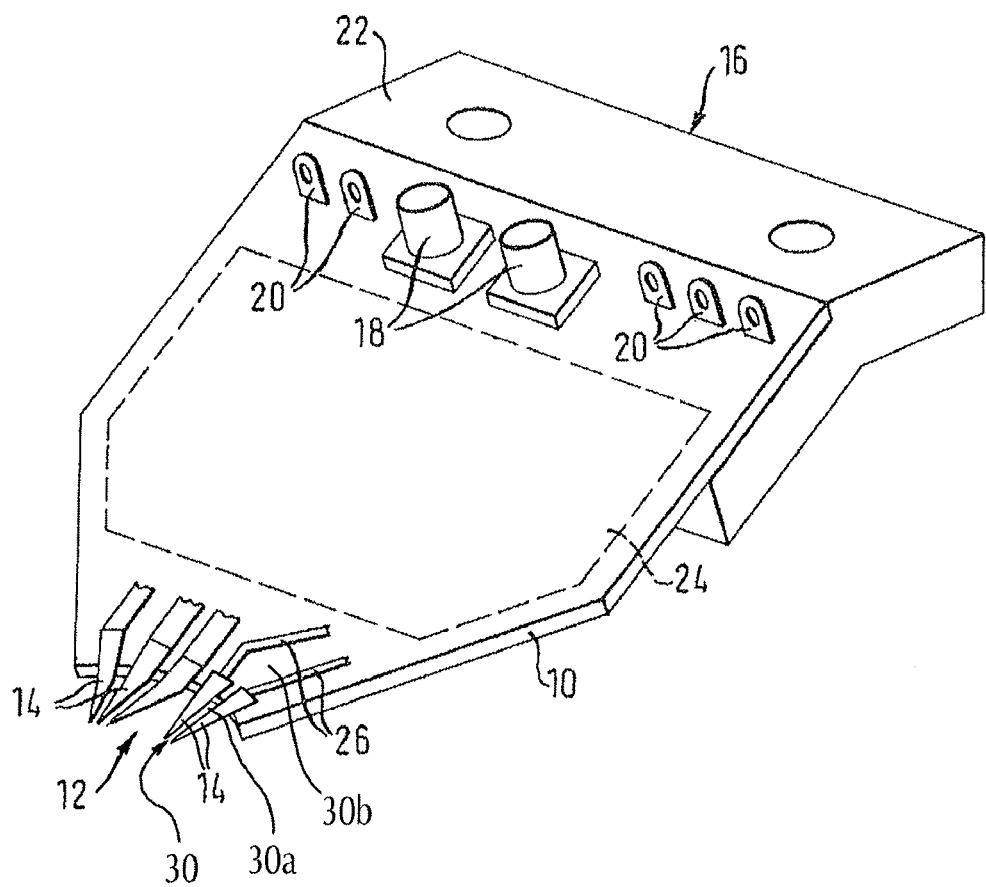

MEASURING TIP FOR HIGH-FREQUENCY MEASUREMENT

BACKGROUND OF THE INVENTION

1. Field of the Invention

The present invention concerns a contact arrangement, in particular for a measuring probe or measuring head, for high-frequency measurement, in particular on a semiconductor wafer, with a contact end for electrically contacting planar structures, where at the contact end there is arranged a coplanar conductor structure with at least two conductors carried by a dielectric, where between the dielectric and the contact end the measurement tip is configured in such a way that the conductors are disposed so as to be free in space and resiliently relative to the retaining dielectric.

2. Description of Related Art

A generic contact arrangement in the form of a measuring tip is known from DE 199 45 178 C2. In order to test electronic circuits, for example those manufactured on wafers, for their functionality and electrical properties, usually such measuring tips are employed that mechanically set down on corresponding contact locations of the electronic circuit to be tested. Such electronic circuits to be tested increasingly generate and/or process high-frequency signals, such as to result in impedance that is to be appropriately taken into account for the measuring tip. In other words, the measuring tip must exhibit at the contact an impedance that is matched with the electric circuit to be tested, otherwise in the case of mismatches, as is generally known, this results in corresponding reflections that affect a measured value in an undesirable way or even make measurement impossible. Also, there should be no variation in impedance over the measuring tip itself, since impedance jumps generate corresponding reflection sites as well.

Document JP 2001066324 A describes a measuring tip adapter that contains a small, unmounted conductor plate and can be connected to a BNC plug. The assembly creates an electric circuit. However, this arrangement is costly to manufacture and assemble. In addition, no precautions are taken for controlled impedance.

SUMMARY OF THE INVENTION

Bearing in mind the problems and deficiencies of the prior art, it is therefore an object of the present invention to provides for improving and/or extending a contact arrangement of the aforementioned type with regard to signal transmission and the possible fields of application.

It is another object of the present invention to provide for a contact arrangement of the aforementioned type with the features identified in the claims.

Still other objects and advantages of the invention will in part be obvious and will in part be apparent from the specification.

The above and other objects, which will be apparent to those skilled in the art, are achieved in the present invention which is directed to a contact arrangement for a measuring probe or measuring head for high-frequency measurement on a semiconductor wafer, comprising: a contact end for electrically contacting planar structures, where at the contact end there is arranged a coplanar conductor structure including at least two conductors carried by a dielectric, where between the dielectric and the contact end a measuring tip is configured such that the at least two conductors of the coplanar conductor structure are disposed so as to be free in space and resiliently relative to the dielectric, the dielectric including at least one arrangement for transmitting electric signals, which is connected electrically to at least one of the at least two conductors of the coplanar conductor structure such that the arrangement transmits signals from the at least one of the at least two conductors that is electrically connected to the arrangement, where between any of the at least two conductors over the entire length of a respective slot in said coplanar conductor structure results in a constant wave resistance over the length of the coplanar conductor structure.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 1 depicts an arrangement for transmitting electric signals in the form of a row of pins for measuring high-frequency semiconductor circuits on a semiconductor wafer.

DESCRIPTION OF THE PREFERRED EMBODIMENT(S)

In describing the preferred embodiment of the present invention, reference will be made herein to FIG. 1 of the drawings in which like numerals refer to like features of the invention.

In a contact arrangement of the aforementioned type the invention provides that on the dielectric there is arranged at least one arrangement for transmitting electric signals, which is electrically connected to at least one conductor of the coplanar conductor structure in such a way that this arrangement transmits signals from the at least one conductor electrically connected to the arrangement.

This has the advantage that several BF signals and/or HF channels can be picked up and transmitted to the contact(s), where an interference-free and maximally loss-free signal transmission is additionally supported by the arrangement. At the same time this results in a compact and/or space-saving construction. Additionally the arrangement makes possible the matching of the contact arrangement to the most varied measurement tasks, such that the contact arrangement's range of applications is extended to measuring tips and pin cards.

In a preferred embodiment there is arranged on the dielectric at least one contact for picking up the electric signal, where the arrangement for transmitting electric signals is arranged and configured in such a way that the arrangement transmits the electric signal from the at least one conductor that is electrically connected to the arrangement to the contact.

For example, the arrangement for transmitting electric signals may be an electronic circuit.

In a preferred embodiment the contact arrangement exhibits a coaxial cable end with a coaxial conductor structure, where the arrangement for transmitting electric signals is connected to at least one coaxial cable termination of the coaxial conductor structure in such a way that the arrangement for transmitting electric signals transmits signals between the at least one conductor that is electrically connected to the arrangement and the at least one coaxial cable termination of the coaxial conductor structure that is electrically connected to the arrangement.

Usefully there are arranged at the coaxial cable end two or more coaxial cable terminations for connecting to a respective coaxial cable that are electrically connected to the arrangement for transmitting electric signals.

Uniform retention in the form of a base plate of the conductors of the coplanar conductor structure, of the arrangement for transmitting electric signals and of the HF and if necessary also of the DC contacts at the coaxial cable end, is achieved by having the dielectric extend up to the coaxial cable end.

In a preferred embodiment the arrangement for transmitting electric signals comprises a rewiring, an adaptive network and/or an active circuit.

For the purpose of transmitting signals, such as supply voltages and/or control signals, there is provided at the dielectric at least one direct current contact that is electrically connected to the arrangement for transmitting electric signals.

In a preferred embodiment there is arranged at the dielectric a retention for a manipulator.

For example, the conductors of the coplanar conductor structure are electrically connected to the respective conductor channels of the arrangement for transmitting electric signals via soldered and/or point-welded connections.

In order to ensure constant wave resistance over the arrangement, there is configured between each two conductors of the coplanar conductor structure over their entire length a respective slot in such a way that a constant wave resistance results over the length of the coplanar conductor structure, where in particular the respective slot is configured to be wider in the region of the dielectric than in the region of the coplanar conductor structure without dielectric.

In order to suppress harmonics above the desired operating frequency the dielectric is metallized over its entire surface on a side facing towards the coplanar conductor structure. This results in a closed, screened structure in the region of the dielectric.

For example, the dielectric is arranged at the coplanar conductor structure at least on one side, in particular on both sides.

The invention is explained in further detail below by reference to the drawing. This shows in the single FIGURE in perspective a preferred embodiment of the invention's arrangement for transmitting electric signals.

The coplanar conductor structure is arranged at the dielectric 10 in such a way that a controlled, predetermined impedance results over the entire length of the coplanar conductor structure. In particular, the lateral spacing 30 between the conductors 14 is appropriately chosen for this purpose. Between the dielectric 10 and the contact end 12 the measuring tip is configured in such a way that the conductors 14 of the coplanar conductor structure are disposed so as to be free in space and resiliently relative to the retaining dielectric 10. The lateral spacing or slot 30 between neighboring conductors 14 of the coplanar conductor structure is chosen to be smaller in the region 30a without dielectric 10 than in the region 30b of the attachment of the conductors 14 of the coplanar conductor structure to the dielectric 10, in order to achieve a constant, predetermined impedance over the entire length of the coplanar conductor structure.

According to the invention, an electronic circuit 24 is provided at the dielectric 10. This electronic circuit 24 is electrically connected to several or all of the conductors 14 of the coplanar conductor structure and to several or all of the coaxial cable terminations 18 and/or direct current contacts 20. In this manner, signals picked up by the conductors 14 of the coplanar conductor structure are conducted forward via the electronic circuit 24 to the coaxial cable terminations 18 and/or the direct current contacts 20. Conversely, signals are transmitted if necessary from the direct current contacts 20 and/or the coaxial cable terminations 18 to the conductors 14 of the coplanar conductor structure. Appropriate conducting channels 26 are configured on the dielectric 10 for connecting the conductors 14 of the coplanar conductor structure and/or the coaxial cable terminations 18 and the direct current contacts 20 to the electronic circuit 24.

Optionally individual coplanar conductors 14 and/or wires are led over the entire length of the dielectric 10 past the electronic circuit 24 and without being electrically connected to it up to the coaxial cable end 16 of the measuring tip and electrically connected directly to a coaxial cable termination 18 or to a direct current contact 20.

The coplanar conductor structure is preferred configured in such a way that its impedance or wave resistance corresponds to the one that the forward-leading wires of the measured circuit and/or of the coaxial cables have. However, for special purposes the impedance of the coplanar conductor structure can also be different from the impedance of the coaxial cables or of the forward-leading wires of the measured circuit.

Thus the dielectric 10, which for example is configured as a conductor plate or substrate, is itself configured for the forward leading of signals. The dielectric 10 can be implemented so as to be self-supporting and does not necessarily need screening.

The electric connection between the conductors 14 of the coplanar conductor structure and the respective conductor channels 26 is made for example by soldering or point-welding.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A contact arrangement for a measuring probe or measuring head for high-frequency measurement on a semiconductor wafer, comprising: a contact end for electrically contacting planar structures, where at the contact end there is arranged a coplanar conductor structure including at least two conductors carried by a dielectric, where between the dielectric and the contact end a measuring tip is configured such that the at least two conductors of the coplanar conductor structure are disposed so as to be free in space and resiliently relative to the dielectric, the dielectric including at least one arrangement for transmitting electric signals, which is connected electrically to at least one of the at least two conductors of the coplanar conductor structure such that the arrangement transmits signals from the at least one of the at least two conductors that is electrically connected to the arrangement, including a respective slot in said coplanar conductor structure between any two conductors of the coplanar conductor structure over said coplanar structure entire length, said slot configured to result in a constant wave resistance over the entire length of the coplanar conductor structure.

2. The contact arrangement of claim 1, wherein said dielectric includes at least one contact for picking up the electric signal, where the arrangement for transmitting electric signals is arranged and configured in such a way that the arrangement transmits the electric signal from the at least one of the at least two conductors that is electrically connected with the arrangement to the contact.

3. The contact arrangement of claim 2 including a coaxial cable end with a coaxial conductor structure, wherein the at least one arrangement for transmitting electric signals is connected to at least one coaxial cable termination of the coaxial conductor structure in such a way that the at least one arrangement transmits signals between the at least one conductor that is electrically connected to the at least one arrangement and the at least one coaxial cable termination of the coaxial conductor structure.

4. The contact arrangement of claim 1 wherein the at least one arrangement for transmitting electric signals is an electronic circuit.

5. The contact arrangement of claim 1 including a coaxial cable end with a coaxial conductor structure, wherein the at least one arrangement for transmitting electric signals is connected to at least one coaxial cable termination of the coaxial conductor structure in such a way that the at least one arrangement transmits signals between the at least one conductor that is electrically connected to the at least one arrangement and the at least one coaxial cable termination of the coaxial conductor structure.

6. The contact arrangement of claim 5 including two or more coaxial cable terminations at the coaxial cable end arranged for connecting to a respective coaxial cable that are electrically connected to the arrangement.

7. The contact arrangement of claim 5 including having the dielectric extend up to the coaxial cable end.

8. The contact arrangement of claim 1 wherein the arrangement for transmitting electric signals comprises a rewiring, an adaptive network, or an active circuit.

9. The contact arrangement of claim 1 wherein the dielectric includes at least one direct current contact that is electrically connected to the arrangement for transmitting electric signals.

10. The contact arrangement of claim 1 wherein the dielectric (10) includes an attachment for a manipulator.

11. The contact arrangement of claim 1 including having the conductors of the coplanar conductor structure electrically connected via soldered or point-welded connections to respective conductor channels of the arrangement for transmitting electric signals.

12. The contact arrangement of claim 1 wherein said respective slot is configured to be wider in the region of the dielectric than in the region of the coplanar conductor structure without dielectric.

13. The contact arrangement of claim 1 including having the dielectric metallized across its entire area on a side facing toward the coplanar conductor structure.

14. The contact arrangement of claim 1 including having the dielectric arranged at the coplanar conductor structure on at least on one side.

15. A contact arrangement for a measuring probe or measuring head for high-frequency measurement on a semiconductor wafer, comprising: a contact end for electrically contacting planar structures, where at the contact end there is arranged a coplanar conductor structure including at least two conductors carried by a dielectric, where between the dielectric and the contact end a measuring tip is configured such that the at least two conductors of the coplanar conductor structure are disposed so as to be free in space and resiliently relative to the dielectric, the dielectric including at least one arrangement for transmitting electric signals, which is connected electrically to at least one of the at least two conductors of the coplanar conductor structure such that the arrangement transmits signals from the at least one of the at least two conductors that is electrically connected to the arrangement, where between any of the at least two conductors over the entire length of a respective slot in said coplanar conductor structure results in a constant wave resistance over the length of the coplanar conductor structure, further including a coaxial cable end with a coaxial conductor structure, wherein the at least one arrangement for transmitting electric signals is connected to at least one coaxial cable termination of the coaxial conductor structure in such a way that the at least one arrangement transmits signals between the at least one conductor that is electrically connected to the at least one arrangement and the at least one coaxial cable termination of the coaxial conductor structure, said respective slot between any two conductors of the coplanar conductor structure over said coplanar structure entire length configured to result in a constant wave resistance over the entire length of the coplanar conductor structure.

* * * * *

UNITED STATES PATENT AND TRADEMARK OFFICE
CERTIFICATE OF CORRECTION

| | | |
|---|---|---|
| PATENT NO. | : 7,786,741 B2 | Page 1 of 1 |
| APPLICATION NO. | : 11/721628 | |
| DATED | : August 31, 2010 | |
| INVENTOR(S) | : Thies et al. | |

It is certified that error appears in the above-identified patent and that said Letters Patent is hereby corrected as shown below:

In Col. 2, Line 39, delete "BF" and substitute therefore -- HF --.

Signed and Sealed this
Third Day of May, 2011

David J. Kappos
*Director of the United States Patent and Trademark Office*